United States Patent
Huang et al.

(10) Patent No.: US 7,987,588 B2
(45) Date of Patent: Aug. 2, 2011

(54) INTERPOSER FOR CONNECTING PLURALITY OF CHIPS AND METHOD FOR MANUFACTURING THE SAME

(75) Inventors: Kuan-Jui Huang, Kao-Hsiung Hsien (TW); Chang-Ping Wang, Taipei (TW); Hsiu-Ming Li, Taipei County (TW); Shih-Min Huang, Taipei (TW); Hui-Chen Kuo, Taoyuan County (TW); Chia-Chun Chen, Kaohsiung County (TW)

(73) Assignee: Touch Micro-System Technology Inc., Taoyuan Hsien (TW)

( * ) Notice: Subject to any disclaimer, the term of this patent is extended or adjusted under 35 U.S.C. 154(b) by 455 days.

(21) Appl. No.: 12/273,550

(22) Filed: Nov. 19, 2008

(65) Prior Publication Data

US 2009/0064496 A1    Mar. 12, 2009

Related U.S. Application Data

(62) Division of application No. 11/756,634, filed on Jun. 1, 2007, now abandoned.

(30) Foreign Application Priority Data

Jan. 29, 2007    (TW) .............................. 96103230 A (51) Int. Cl.
    *H05K 3/02*    (2006.01)

(52) U.S. Cl. ............... 29/846; 29/825; 29/830; 29/831; 29/852

(58) Field of Classification Search ............ 29/825, 29/846, 830, 831, 852, 843; 438/106, 126, 438/112, 118, 119, 974, 975; 439/66, 67, 439/70–71, 81, 74, 91; 257/686, 698, 700, 257/723, 777, 778
See application file for complete search history.

(56) References Cited

U.S. PATENT DOCUMENTS

| | | | |
|---|---|---|---|
| 6,350,668 B1 * | 2/2002 | Chakravorty | 438/612 |
| 6,570,098 B2 * | 5/2003 | Shimizu et al. | 174/255 |
| 6,941,648 B2 * | 9/2005 | Shimizu et al. | 29/830 |
| 2006/0186524 A1 | 8/2006 | Aiba | |

* cited by examiner

*Primary Examiner* — Derris H Banks
*Assistant Examiner* — Tai Nguyen
(74) *Attorney, Agent, or Firm* — Chen Yoshimura LLP (57) ABSTRACT

The invention discloses an interposer used for connecting a plurality of chips. The interposer includes a connective substrate and at least a through via disposed in the connective substrate. The connective substrate has a first surface and a second surface. The through via acts as a connector, and is electrically connected to the first surface and the second surface. The first surface and the second surface are electrically connected to at least a first chip and a second chip respectively. In addition, the first chip and the second chip are electrically connected by the through via.

5 Claims, 13 Drawing Sheets

INTERPOSER FOR CONNECTING PLURALITY OF CHIPS AND METHOD FOR MANUFACTURING THE SAME

CROSS REFERENCE TO RELATED APPLICATIONS

This application is a division of applicant's earlier application, Ser. No. 11/756,634, filed Jun. 1, 2007, which is included herein by reference.

BACKGROUND OF THE INVENTION

1. Field of the Invention

The invention is related to an interposer, and particularly to an interposer capable of connecting several chips and reducing the size of a package having the interposer therein.

2. Description of the Prior Art

In recent years, consumer electronic devices have become smaller and lighter. In addition, high performance, high speed, large capacity, multi-functionality, and less electrical consumption are desired goals promoting technical development of these electric products.

Figure 1:
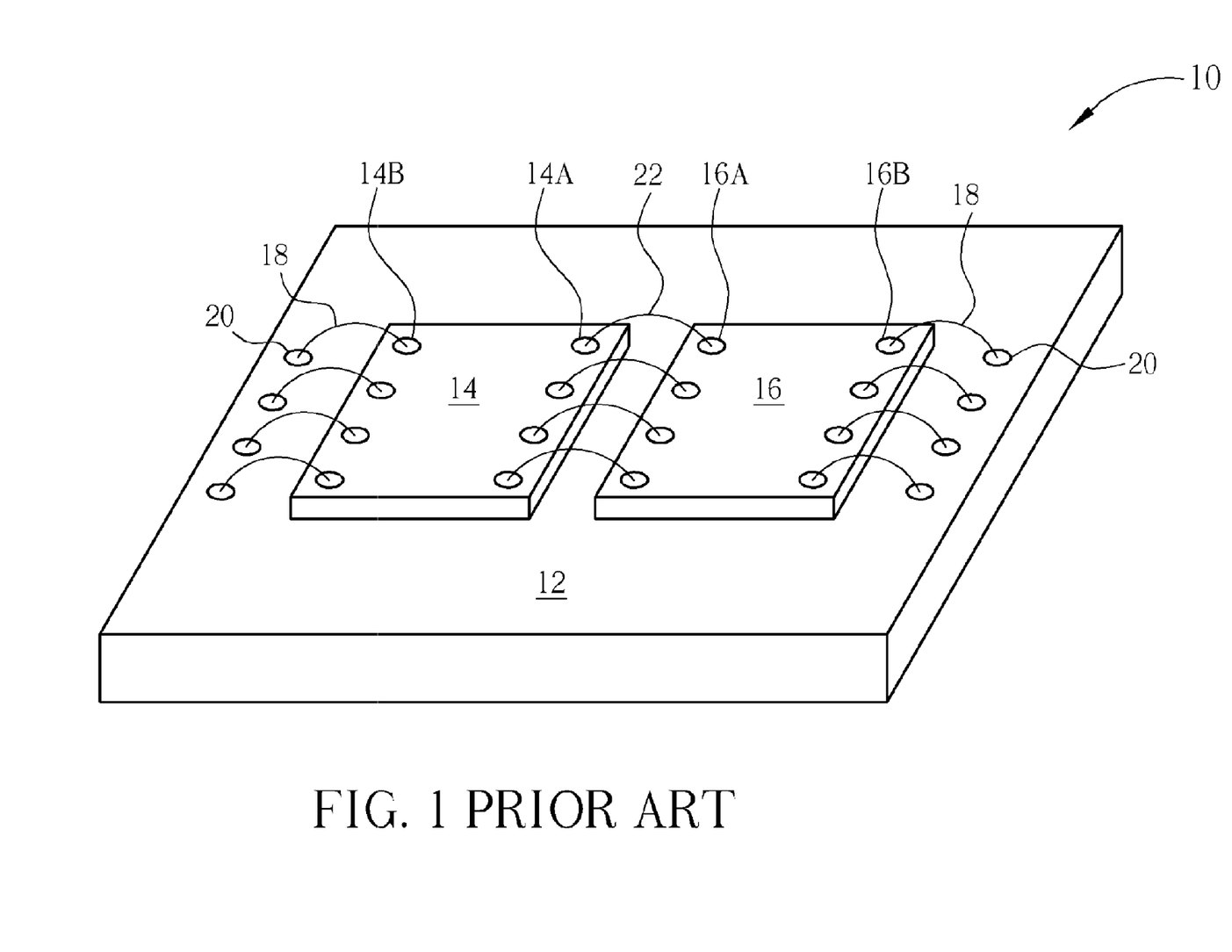
FIG. 1 is a schematic diagram of a conventional package.

Please refer to FIG. 1, which is a schematic diagram of a conventional package 10. FIG. 1 shows a package 10 having a package substrate 12 and two chips 14, 16 respectively disposed on each surface thereof. The chips 14, 16 have a plurality of respective contact pads 14A, 14B, 16A, 16B, which are electrically connected to a plurality of contact pads 20 disposed on a surface of the package substrate 12 through a plurality of wires 18 and 22 respectively. A package material (not shown) is formed covering the chips 14, 16, the contact pads 14A, 14B, 16A, 16B, the wires 18, 22, and the contact pad 20 disposed on the surface of the package substrate 12. The package 10 is mounted on a print circuit board by bumps (not shown) or leads (not shown) of various sizes to form an electronic system with other active or passive elements to be utilized in consumer electronic devices.

Since consumer electrical devices are tending towards miniaturization, the distance between the chips 14 and 16 of the package 10 will be reduced to decrease the area of the package 10. However, the reduced distance between the chips 14 and 16 results in problems, such as raising the difficulty and complexity in wiring, or electromagnetic interference between the chips 14 and 16.

SUMMARY OF THE INVENTION

It is therefore a primary objective of the present invention to provide an interposer for connecting a plurality of chips to overcome the abovementioned wiring difficulty.

According to the present invention, an interposer for connecting a plurality of chips is provided. The interposer has a connective substrate, at least a through via positioned in the connective substrate, and at least a first chip and a second chip. The connective substrate has a first surface and a second surface. The first chip is electrically connected to the first surface, and the second chip is electrically connected to the second surface. Both the first chip and the second chip are flip-chips. The through via acts as a connector and electrically connects the first surface and the second surface of the connective substrate.

The present invention further provides a method of forming an interposer. Initially, a connective substrate having a first surface and a second surface is provided. The first surface includes at least a first dielectric layer, at least a first interconnection, and at least a first contact pad. An adhesive layer is provided to bond the first surface to a carrier. At least a through hole is formed on the second surface, and the through hole penetrates the connective substrate. A conductive layer is formed to fill the through via and to form a through via connecting the first surface and the second surface. Afterwards, at least a second dielectric layer, at least a second interconnection, and at least a second contact pad are formed on the second surface of the connective substrate. In addition, the second interconnection and the second contact pad are electrically connected to the first interconnection and the first contact pad on the first surface. Then, the first surface and the wafer carrier are separated.

The interposer of the present invention is capable of connecting two or more chips, or other components requiring signal transmission. The use of the interposer reduces the area of the package and the size of the electronic systems or barebones having the interposer therein. The interposer is used for several types of packages. Therefore, the interposer overcomes the wiring difficulty and increases the yield of the packaging.

These and other objectives of the present invention will no doubt become obvious to those of ordinary skill in the art after reading the following detailed description of the preferred embodiment that is illustrated in the various figures and drawings.

DETAILED DESCRIPTION

Hereinafter, preferred embodiments of the present invention will be described with reference to the accompanying drawings, in which components with substantially the same functions are identified by the same reference numeral for the sake of simplicity. It should be noted, however, that the present invention is in no way limited to the following illustrative embodiments.

Figure 2:
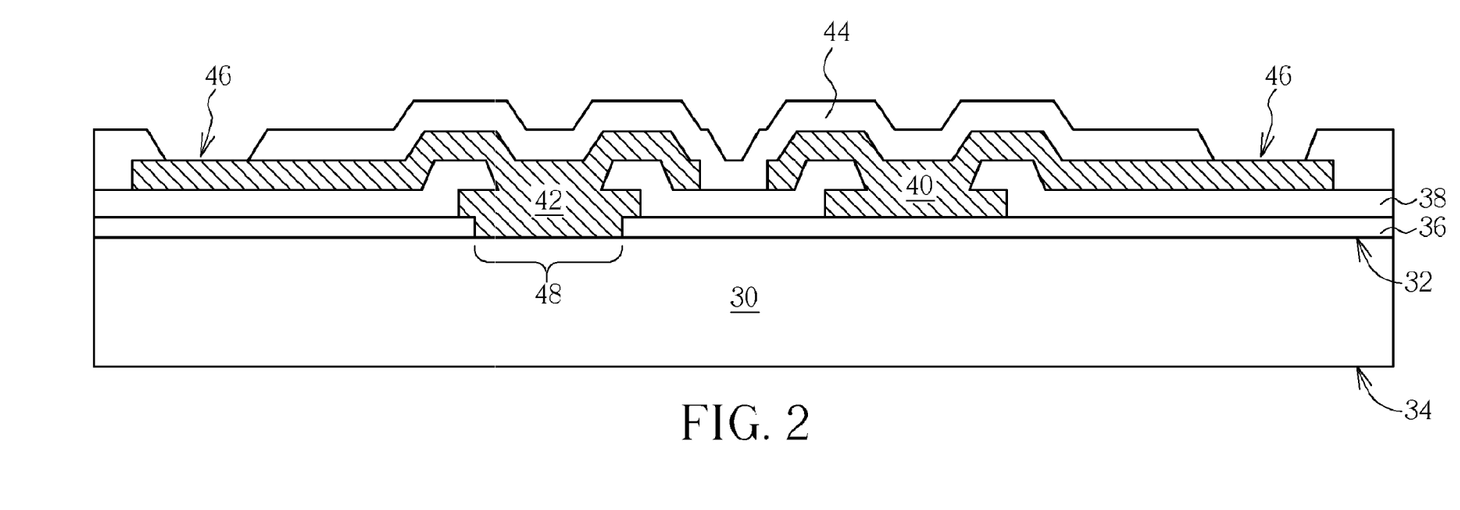
FIGS. 2-10 are schematic diagrams illustrating a method of forming an interposer according to a preferred embodiment of the present invention.

Please refer to FIGS. 2-10. FIGS. 2-10 are schematic diagrams illustrating a method of forming an interposer according to a preferred embodiment of the present invention. As shown in FIG. 2, a connective substrate 30, such as a wafer, is provided. The connective substrate 30 has a first surface 32 and a second surface 34. A silicon oxide layer 36, at least a dielectric layer, and at least a conductive layer is formed on the first surface 32, and several processes, including deposition, lithography, and etching processes, are performed to form at least an interconnection embedded through the dielectric layer and at least an exposed contact pad for electrical connection. For simplicity of description, FIG. 2 only shows a double-layered interconnection for illustration, but single-layered or multi-layered interconnections are allowable. As shown in FIG. 2, a plurality of the first dielectric layers 38 and a plurality of first interconnections 42, 42 embedded through the first dielectric layers 38 are formed on the first surface 32. A protective layer 44 is formed to cover the first dielectric layers 38 and the first interconnections 42, 44, and to expose a plurality of first contact pads 46. The silicon oxide layer 36 acts as a preventable and stress buffer layer, and has at least an opening 48 for electrical connection between the first surface 32 and the second surface 34. The thickness, critical dimension, and pattern layout of the first interconnection 40, 42 may be modified depending on requirements. In order to reduce the resistance of the first interconnections 40, 42, the interconnections 40, 42 preferably have a thickness of 0.5 micrometers (µm) and a critical dimension of at least 10 µm. The material of the first interconnections 40, 42 includes AlCu, Cu, Al, Au, or other material of low-resistance to reduce signal loss during signal transmission.

Figure 3:
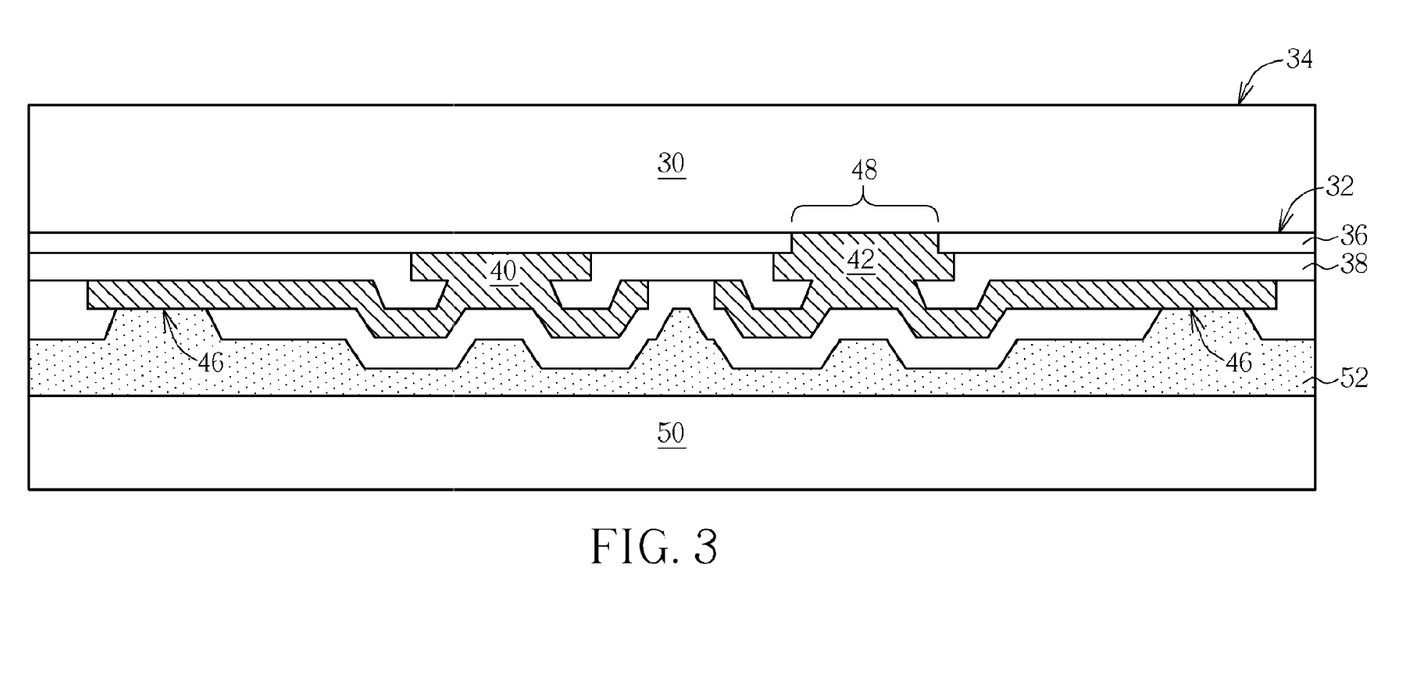
Figure 4:
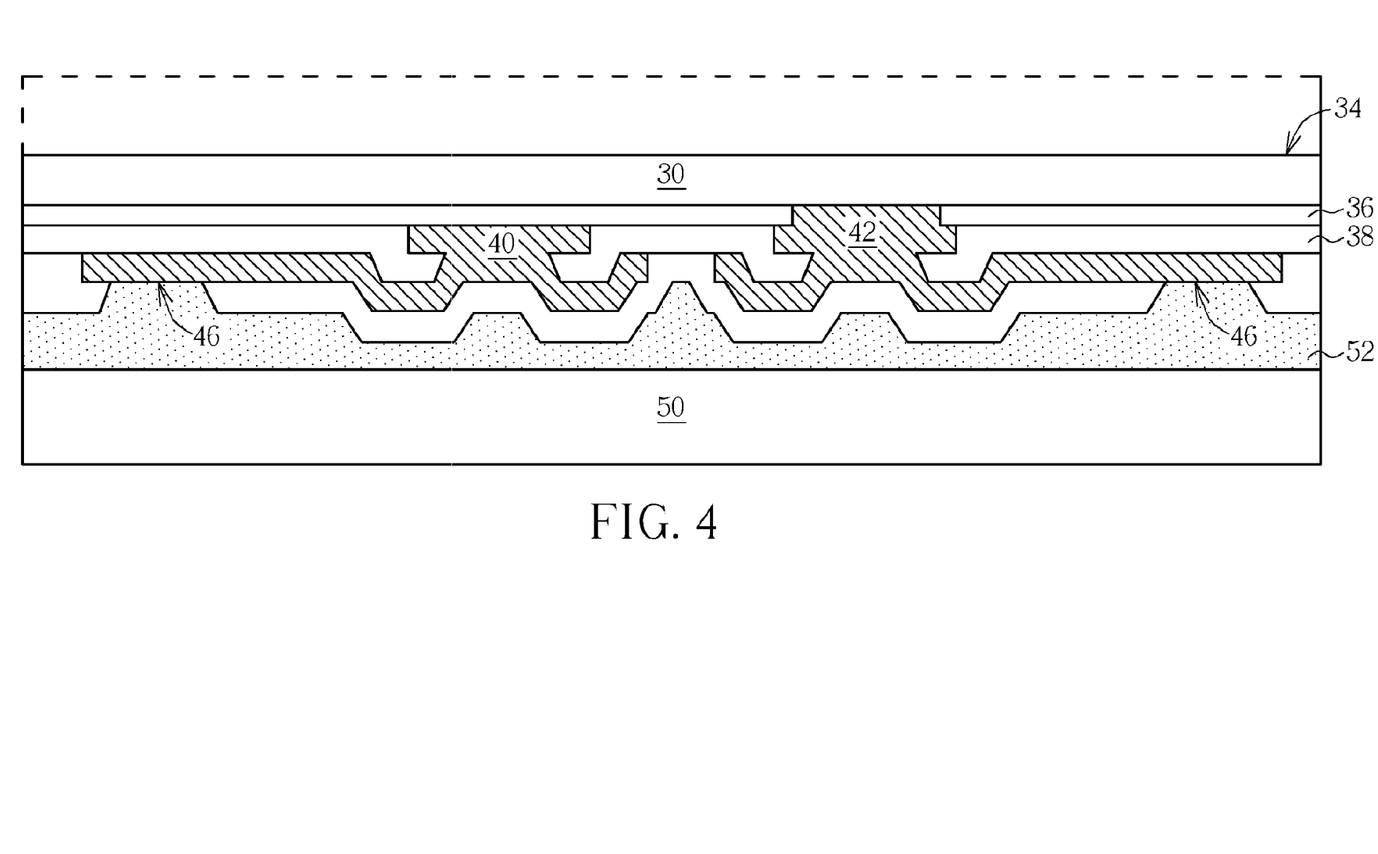

As shown in FIG. 3, a wafer carrier 50 and an adhesive layer 52, such as a piece of tape or other substance for temporary bonding, are provided. The adhesive layer 52 bonds the first surface 32 having the first dielectric layer 38, the first interconnections 40, 42 and the first contact pad 46 thereon to the wafer carrier 50. As shown in FIG. 4, a thinning process, for example a CMP process, is performed on the second surface 34 to reduce the thickness of the connective substrate 38. Additionally, the thinning process is optionally performed depending on the thickness of the connective substrate 30. The thinning process is not limited to the CMP process illustrated in the present embodiment, and other methods capable of reducing the thickness of the substrate or wafer are allowable.

Figure 5:
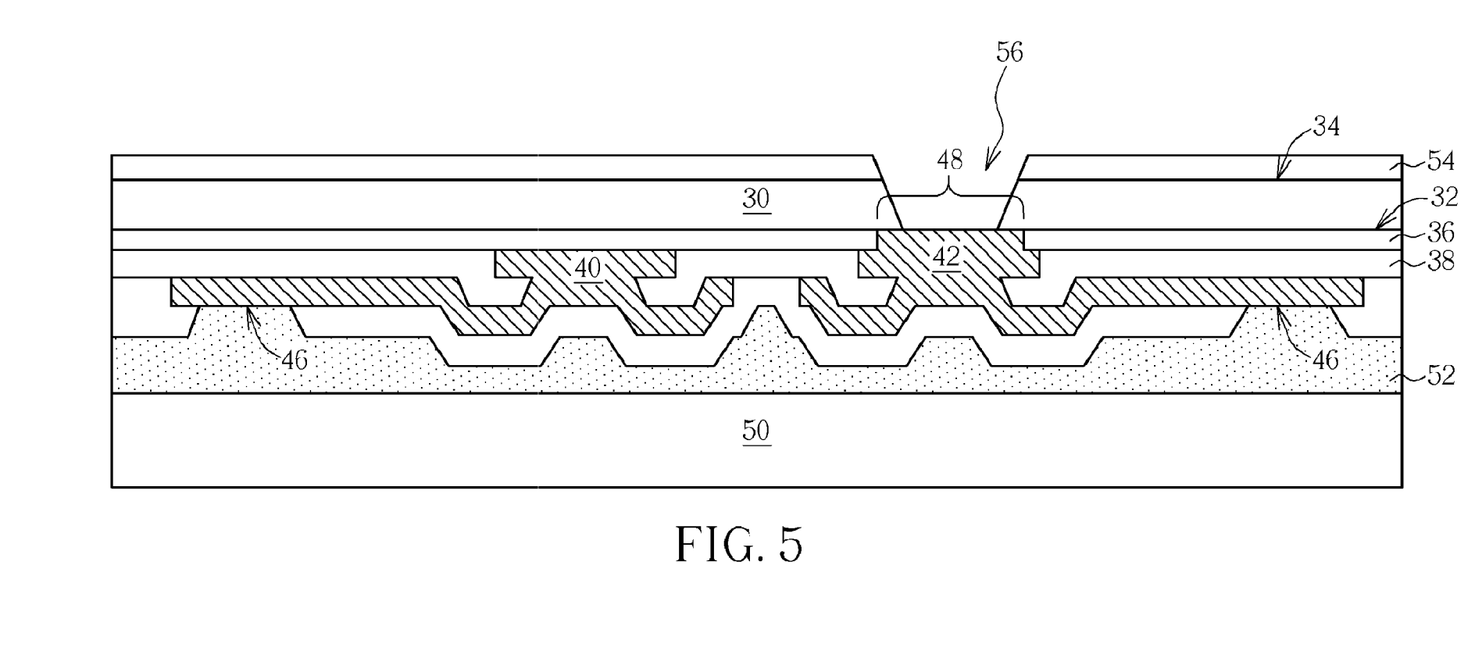
Figure 6:
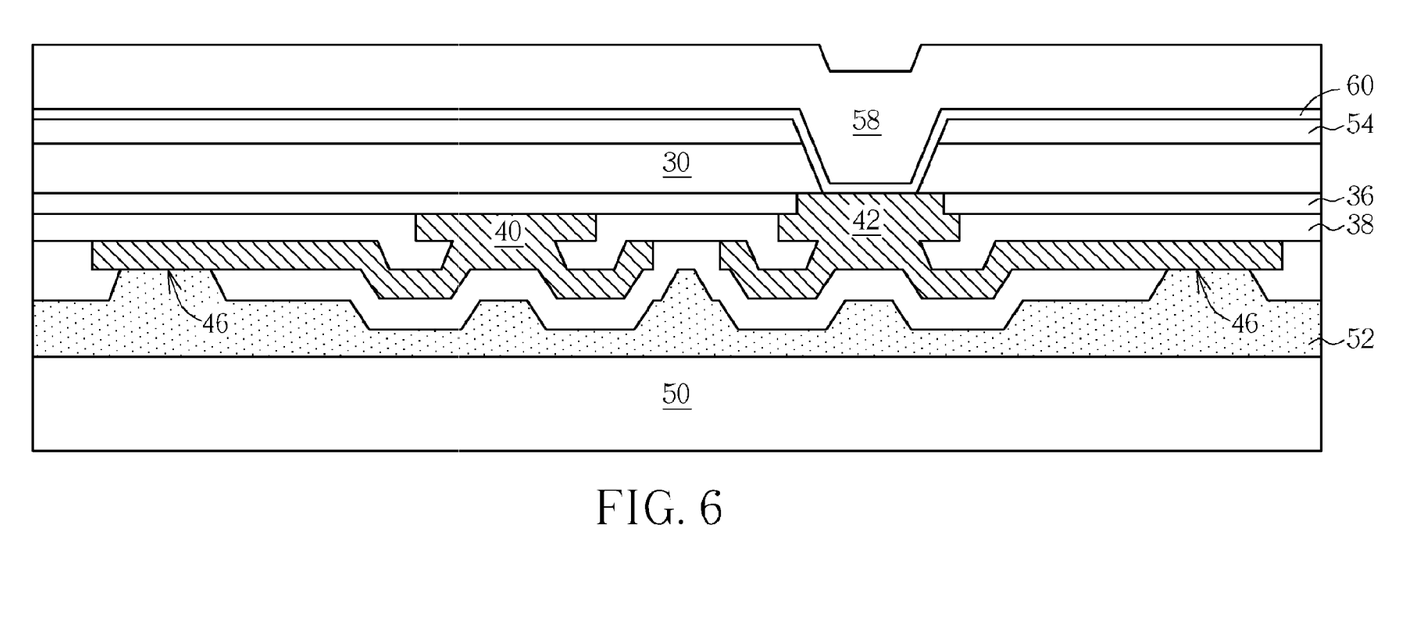
Figure 7:
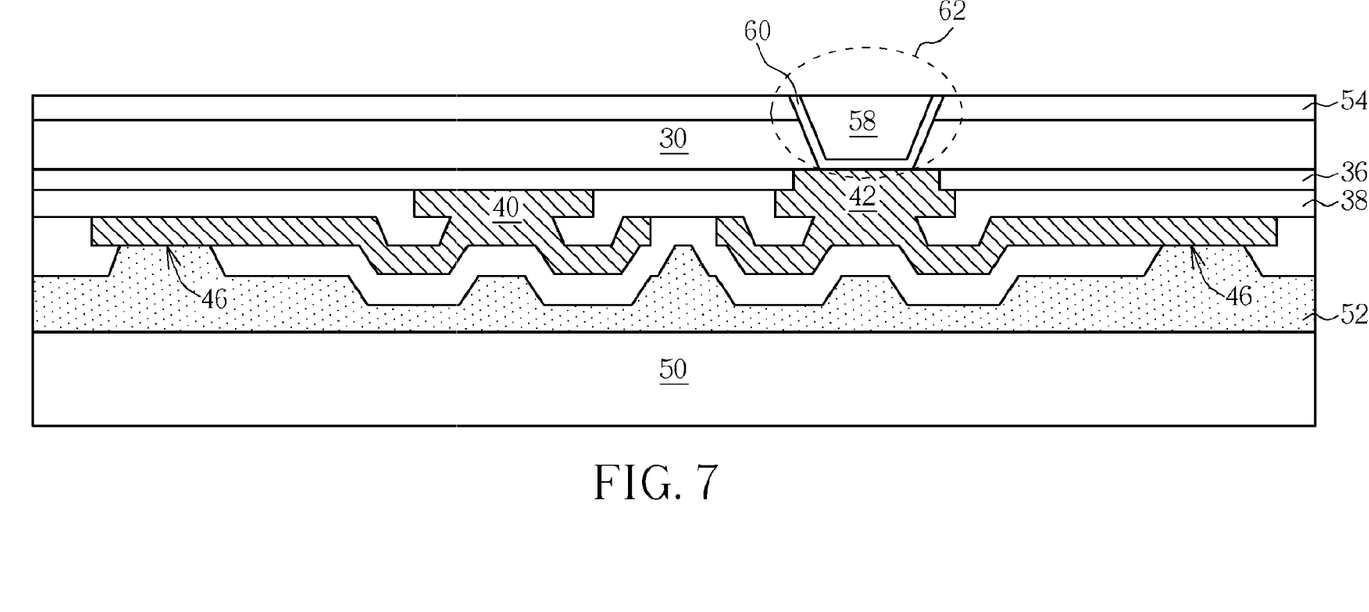

Referring to FIG. 5, a silicon oxide layer 54 is deposited on the second surface 34 of the connective substrate 34. The silicon oxide layer 54 may act as a preventable and stress buffer layer. A lithography and etching process is performed on the second surface 34 to remove a part of the silicon oxide layer 54 and form a through hole 56 in the connective substrate 30, wherein the first interconnection 42 acts as an etch stop layer. Referring to FIG. 6, a conductive layer 58 is formed to fill the through hole 56. In the present embodiment, a seed layer 60 of Cu is formed on the silicon oxide layer 54 and a surface of the through hole 56 by sputtering. Then, an electroplating process is performed to form a conductive layer 58 of Cu on a surface of the seed layer 56. As shown in FIG. 7, a planarization process is performed to remove a part of the conductive layer 58 and the Cu seed layer 60 disposed on the surface of the silicon oxide layer 54. Therefore, a through via 62 is formed. The material of the conductive layer 56 or the through via 62 may also include AlCu, Al, or Au. The method of forming the through via 62 is not limited to sputtering, electroplating, or the CMP processes illustrated in the present embodiment, and other processes known by those skilled in the art to stuff the through via 56 and form the through via 62 are allowable.

Figure 8:
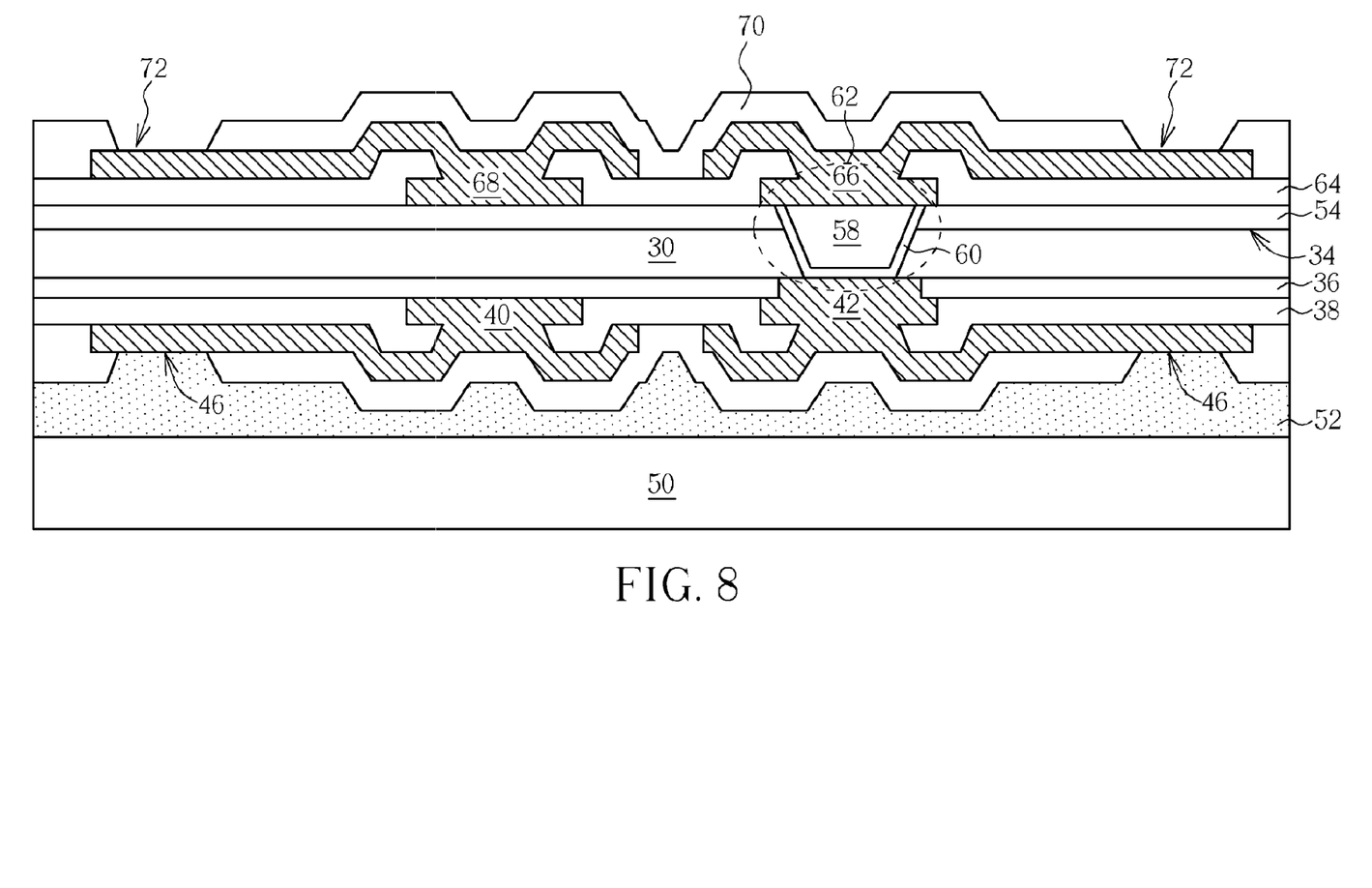

Afterwards, at least a dielectric layer and at least a conductive layer are formed on the second surface 34. Through the lithography and etching processes, interconnections are defined and embedded through the dielectric layer. For simplicity of description, a double-layered interconnection is illustrated in the present embodiment, but other types of interconnections are allowable. As shown in FIG. 8, a plurality of second dielectric layers 64 and a plurality of second interconnections 66, 68 embedded through the second dielectric layer 64 are formed on the second surface 32 of the connective substrate 30. A protective layer 70 is formed on the second dielectric layers 64 and the second interconnections 66, 68, to expose a plurality of second contact pads 72. It should be noted that the first interconnection 42 on the first surface 32 is electrically connected to the second interconnection 66 on the second surface 34 by the through via 62 disposed in the connective substrate 30 for signal transmission. The thickness, critical dimension, and pattern layout of the second interconnection 66, 68 may be modified depending on requirements. In order to reduce the resistance of the second interconnections 66, 68, the second interconnections 66, 68 preferably have a thickness of 0.5 µm and a critical dimension of at least 10 µm. The material of the second interconnections 66, 68 includes AlCu, Cu, Al, Au, or other material of low-resistance to reduce signal loss during signal transmission.

Figure 9:
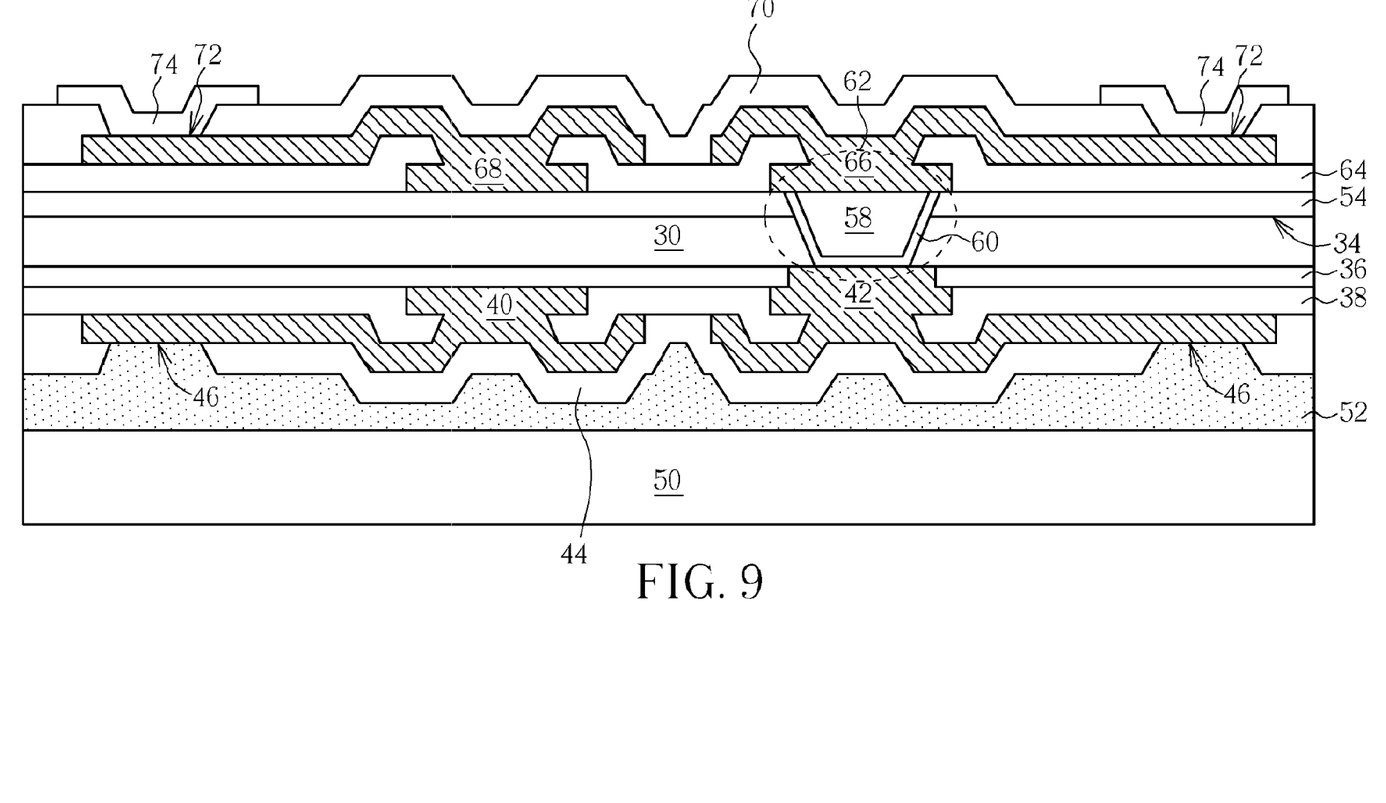

As shown in FIG. 9, a plurality of second under bump metallurgies 74 are respectively formed on a surface of a plurality of second contact pads 72. The second under bump metallurgies 74 may be formed optionally on the second contact pads 72. The position and quantity of the second under bump metallurgies 74 depend on the size of the intended chip and connection types between the under bump metallurgies 74 and the intended chip(s). For the same reason, if a flip-chip is intended to connect the first surface 32, a plurality of first under bump metallurgies (not shown) may be respectively formed on a surface of the first contact pads 46.

Figure 10:
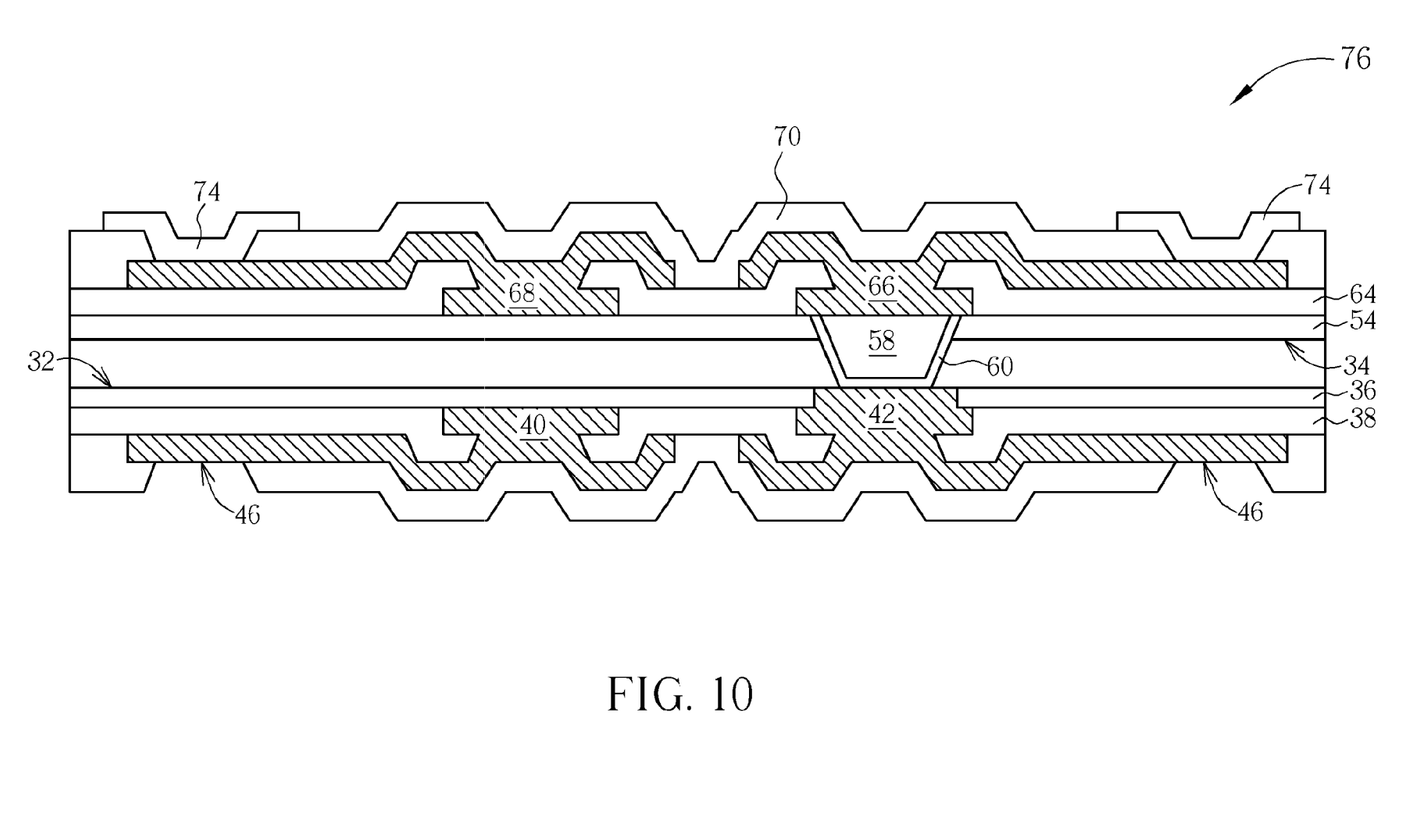

Please refer to FIG. 10. The adhesive layer 52 is removed without impairing any elements on the first surface 32. Thus, the first surface 32 and the wafer carrier 50 (not shown) are separated and an interposer 76 of the present invention is formed.

Figure 11:
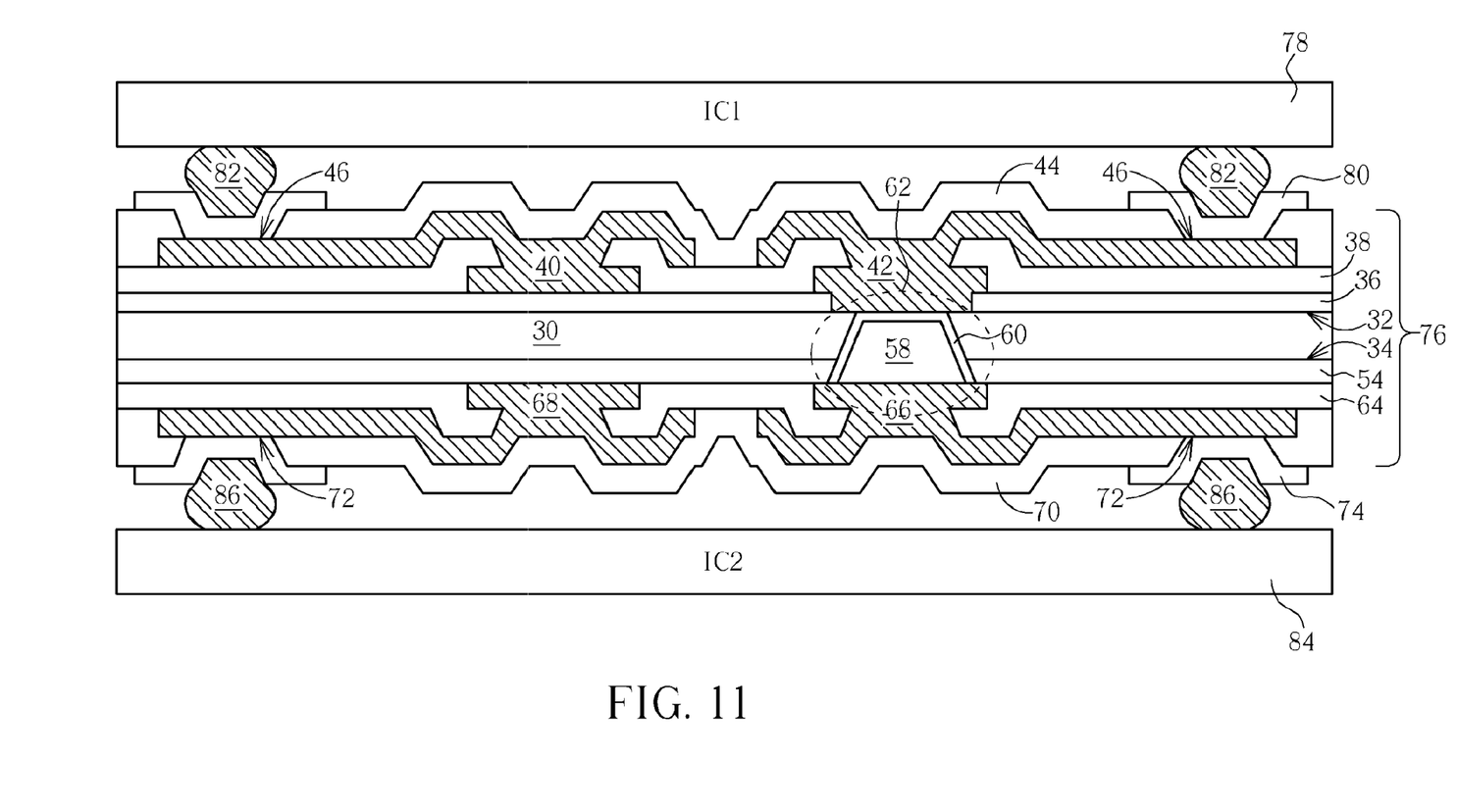
FIG. 11 is a schematic diagram illustrating the interposer for connecting a plurality of chips according to another preferred embodiment of the present invention.

Hereinafter, the interposer 76 is formed and capable of connecting several chips. Please refer to FIG. 11, which is a schematic diagram illustrating the interposer for connecting a plurality of chips according to another preferred embodiment of the present invention. Components with substantially the same functions are identified by the same reference numeral for the sake of simplicity. The interposer 76 includes a connective substrate 30 having a first surface 32 and a second surface 34, and a through via 62 disposed in the connective substrate 30. The interposer 76 further includes the silicon oxide layer 36, the first dielectric layer 38, the first interconnections 40, 42, the first contact pads 46, and the protective layer 44 disposed on the first surface 32. Furthermore, at least a first chip (IC1) 78, which is a flip-chip, is disposed on the first surface 32. The first chip 78 is electrically connected to the first surface 32 by the first under bump metallurgies 80, and a plurality of first bumps 82 sandwiched between the first under bump metallurgies 80 and the first chip 78. The interposer 78 also has the silicon oxide 54, the second dielectric layer 64, the second interconnections 66, 68, and the second contact pads 72, and the protective layer 70 on the second surface 34. At least a second chip (IC2) 84, which is a flip-chip, is electrically connected to the second surface 34 by the second under bump metallurgies 74 and a plurality of second bumps 86 sandwiched between the second under bump metallurgies 74 and the second chip 84. It should be noted that the through via 62 acts as a connector electrically connecting the first interconnection 42 on the first surface 32 and the second interconnection 66 on the second surface 34. Consequently, the first chip 78 and the second chip 84 are electrically connected by the through via 62. The present embodiment only shows a through via 62 in FIG. 11 for illustration, but the present invention is not limited to this. The quantity and the position of the through via 62 may be modified depending on requirements of the products.

Figure 12:
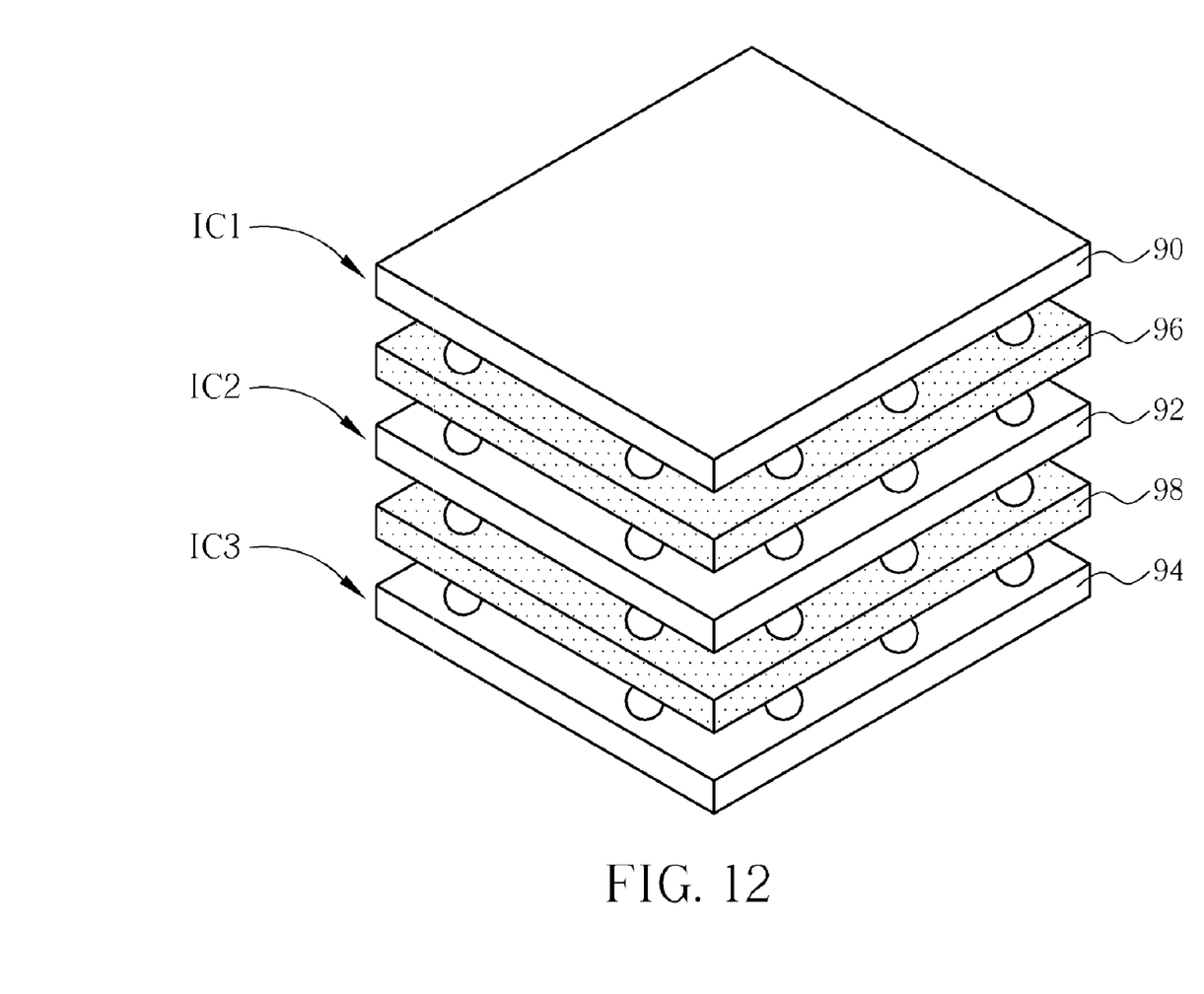
FIG. 12 further discloses the interposers of the present invention connecting three chips according to a preferred embodiment of the present embodiment.
Figure 13:
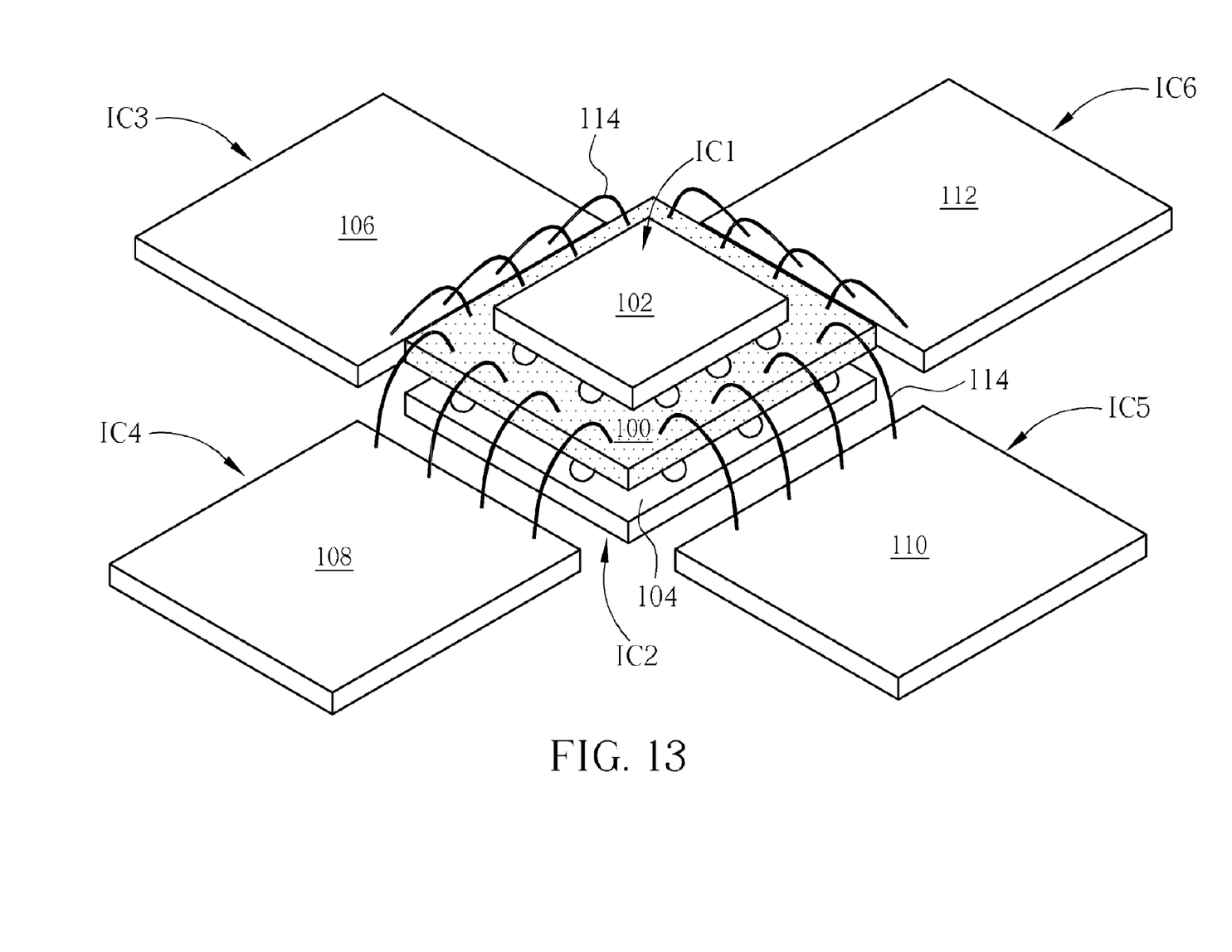
FIG. 13 is a schematic diagram illustrating the interposer connecting several chips in vertical and horizontal directions according to a preferred embodiment of the present invention.

Please refer to FIG. 12. FIG. 12 further discloses the interposers of the present invention connecting three chips according to a preferred embodiment of the present embodiment. As shown in FIG. 12, a first interposer 96 is sandwiched between a first chip (IC1) 90 and a second chip (IC2) 92, and a second interposer 98 is sandwiched between the second chip 92 and a third chip (IC3) 94. The chips 90, 92, 94 are flip-chips. Consequently, signals may be transmitted among three chips 90, 92, 94 through the first interposer 96 and the second interposer 98. However, the use of the interposer is not limited to those shown in FIGS. 11 and 12, in which the interposers connect the flip-chips and transmit signals vertically. The interposer of the present invention may also connect the chips in vertical and horizontal directions. Please refer to FIG. 13, which is a schematic diagram illustrating the interposer connecting several chips in vertical and horizontal directions according to another preferred embodiment of the present invention. A first chip (IC1) 102 and a second chip (IC2) 104 are electrically connected by an interposer 100 in the vertical direction. Both the first chip 102 and the second chip 104 are flip-chips. Additionally, a third chip (IC3) 106, a fourth chip (IC4) 108, a fifth chip (IC5) 110, and a sixth chip (IC6) 112 are electrically connected to either surface of the interposer 110 by a plurality of wires 114 in a horizontal direction.

The present invention uses double-layered interconnections for illustration, but other types of interconnections with single-layer or multi-layered structures are allowable. The aforementioned embodiments only connect a flip-chip to each surface of the interposer. In addition, the interposer may be modified with different sizes and pattern layouts for electrically connecting two or more flip-chips on the first surface or the second surface of the interposer. Furthermore, the material of the protective layer, the first dielectric layer on the first surface, and the second dielectric layer on the second surface may include silicon oxide, silicon nitride, or other materials having isolation property.

The interposer and the connected chips may be regarded as a module. The module may be mounted on a package substrate and covered by a package material. The module also connects to a print circuit board and other passive or active elements by bumps or wires for composing a complete electronic system.

According to the above, the interposer of the present invention electrically connects the chips on the first surface and the second surface by the through via. The interposer may also connect two or more chips for signal transmission. Therefore, the area of the package having the interposer and the connected chips therein may be reduced. Furthermore, the interposer may be used in several types of packages and overcome the difficulty in wiring of the prior art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming an interposer, comprising:
   providing a connective substrate having a first surface and a second surface, the connective substrate further comprising at least a first dielectric layer, at least a first interconnection and at least a first contact pad disposed on the first surface;
   providing an adhesive layer to bond the first surface to a wafer carrier;
   forming at least a through hole on the second surface of the connective substrate;
   forming a conductive layer to fill the through hole and forming a through via between the first surface and the second surface;
   forming at least a second dielectric layer, at least a second interconnection, and at least a second contact pad on the second surface of the connective substrate, wherein the through via electrically connects the second interconnection and the second contact pad; and
   separating the first surface and the wafer carrier.

2. The method of claim 1, further comprising:
   forming a stress buffer layer on the second surface of the connective substrate after the first surface is bonded to the wafer carrier.

3. The method of claim 1, further comprising:
   forming a protective layer covering the second dielectric layer and the second interconnection and exposing the second contact pad, after the second dielectric layer, the second interconnection, and the second contact pad are formed on the second surface of the connective substrate.

4. The method of claim 1, wherein a thinning process is optionally performed on the second surface of the connective substrate after the first surface of the connective substrate is bonded to the wafer carrier.

5. The method of claim 1, wherein forming the through via further comprises:
   performing an electroplating process to form the conductive layer covering the second surface and filling the through hole; and
   performing a planarization process to remove a part of the conductive layer on the second surface of the connective substrate and form the through via.

* * * * *